United States Patent
Lauter et al.

(10) Patent No.: US 9,255,214 B2
(45) Date of Patent: Feb. 9, 2016

(54) CHEMICAL MECHANICAL POLISHING (CMP) COMPOSITION COMPRISING INORGANIC PARTICLES AND POLYMER PARTICLES

(75) Inventors: Michael Lauter, Mannheim (DE); Vijay Immanuel Raman, Mannheim (DE); Yuzhuo Li, Heidelberg (DE); Shyam Sundar Venkataraman, Zhongli (TW); Daniel Kwo-Hung Shen, Junghe (TW)

(73) Assignee: BASF SE, Ludwigshafen (DE)

( * ) Notice: Subject to any disclaimer, the term of this patent is extended or adjusted under 35 U.S.C. 154(b) by 355 days.

(21) Appl. No.: 13/503,753

(22) PCT Filed: Nov. 10, 2010

(86) PCT No.: PCT/IB2010/055101
§ 371 (c)(1),
(2), (4) Date: Apr. 24, 2012

(87) PCT Pub. No.: WO2011/058503
PCT Pub. Date: May 19, 2011

(65) Prior Publication Data
US 2012/0208344 A1   Aug. 16, 2012

Related U.S. Application Data

(60) Provisional application No. 61/260,873, filed on Nov. 13, 2009.

(51) Int. Cl.
*H01L 21/76*   (2006.01)
*C09G 1/02*   (2006.01)
(Continued)

(52) U.S. Cl.
CPC ............... *C09G 1/02* (2013.01); *C09K 3/1409* (2013.01); *C09K 3/1463* (2013.01); *H01L 21/31053* (2013.01)

(58) Field of Classification Search
USPC .......... 438/693, 691, 633, 959; 257/E21.304, 257/E21.244, E21.23, E21.583, E21.237
See application file for complete search history.

(56) References Cited

U.S. PATENT DOCUMENTS

| 4,954,142 A | 9/1990 | Carr et al. |
| 6,050,885 A | 4/2000 | Morsch et al. |
| 6,093,091 A | 7/2000 | Keller |

(Continued)

FOREIGN PATENT DOCUMENTS

| EP | 1 036 836 | 9/2000 |
| EP | 1 243 611 | 9/2002 |

(Continued)

OTHER PUBLICATIONS

U.S. Appl. No. 13/820,765, filed Apr. 25, 2013, Li, et al.
(Continued)

*Primary Examiner* — Jaehwan Oh
(74) *Attorney, Agent, or Firm* — Oblon, McClelland, Maier & Neustadt, L.L.P.

(57) ABSTRACT

A chemical mechanical polishing (CMP) composition, comprising (A) at least one type of inorganic particles which are dispersed in the liquid medium (C), (B) at least one type of polymer particles which are dispersed in the liquid medium (C), (C) a liquid medium, wherein the zeta-potential of the inorganic particles (A) in the liquid medium (C) and the zeta-potential of the polymer particles in the liquid medium (C) are of same signs.

19 Claims, 4 Drawing Sheets

(51) Int. Cl.
*H01L 21/3105* (2006.01)
*C09K 3/14* (2006.01)

(56) References Cited

U.S. PATENT DOCUMENTS

| | | | |
|---|---|---|---|
| 6,447,373 | B1 | 9/2002 | Lack et al. |
| 6,559,056 | B2 | 5/2003 | Hattori et al. |
| 6,767,276 | B2 | 7/2004 | Keller |
| 7,207,871 | B1 | 4/2007 | Zuniga et al. |
| 2004/0065021 | A1* | 4/2004 | Yoneda et al. ............ C09G 1/02 51/298 |
| 2004/0152309 | A1* | 8/2004 | Carter et al. ............ C03C 19/00 438/689 |
| 2007/0243710 | A1 | 10/2007 | Yi et al. |
| 2011/0092635 | A1 | 4/2011 | Venkatesh et al. |
| 2011/0269312 | A1 | 11/2011 | Li et al. |
| 2012/0045970 | A1 | 2/2012 | Li et al. |
| 2012/0058641 | A1 | 3/2012 | Raman et al. |
| 2012/0058643 | A1 | 3/2012 | Raman et al. |
| 2012/0077419 | A1 | 3/2012 | Zhang et al. |

FOREIGN PATENT DOCUMENTS

| | | |
|---|---|---|
| WO | 2004 063301 | 7/2004 |
| WO | 2007 119965 | 10/2007 |

OTHER PUBLICATIONS

U.S. Appl. No. 13/878,361, filed May 28, 2013, Raman, et al.
U.S. Appl. No. 13/515,514, filed May 17, 2012, Raman, et al.
U.S. Appl. No. 13/510,830, filed May 18, 2012, Raman, et al.
A.V. Delgado, et al., "Measurement and interpretation of electrokinetic phenomena", Journal of Colloid and Interface Science, vol. 309, 2007, pp. 194-224.
S. Armini, et al., "Engineering Polymer Core-Silica Shell Size in the Composite Abrasives for CMP Applications", Electrochemical and Solid-State Letters, vol. 11, 2008, pp. H280-H284.
Pascal Borget, et al., "Characterizations and properties of hairy latex particles", Journal of Colloid and Interface Science, vol. 285, 2005, pp. 136-145.
U.S. Appl. No. 13/580,039, filed Aug. 20, 2012, Raman, et al.
U.S. Appl. No. 13/821,757, filed Mar. 8, 2013, Li, et al.
U.S. Appl. No. 13/991,924, filed Jun. 6, 2013, Venkataraman, et al.
International Search Report Issued Mar. 17, 2011 in PCT/IB10/55101 Filed Nov. 10, 2010.
U.S. Appl. No. 13/821,759, filed Apr. 25, 2013, Noller, et al.
U.S. Appl. No. 13/821,746, filed Mar. 8, 2013, Li, et al.
U.S. Appl. No. 13/821,769, filed Mar. 8, 2013, Li, et al.
U.S. Appl. No. 14/356,530, May 6, 2014, Seyffer, et al.
U.S. Appl. No. 14/239,806, Feb. 20, 2014, Li, et al.

* cited by examiner

CHEMICAL MECHANICAL POLISHING (CMP) COMPOSITION COMPRISING INORGANIC PARTICLES AND POLYMER PARTICLES

This invention essentially relates to a chemical mechanical polishing (CMP) composition and its use in polishing substrates of the semiconductor industry. The inventive CMP composition comprises inorganic particles and polymer particles and shows an improved polishing performance.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP slurry or CMP composition. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP slurry or CMP composition is usually applied between the to-be-polished wafer and the polishing pad.

There are two kinds of to-be-polished surfaces: Unstructured surface that is a blanket surface which has a very similar height over the entire surface area; and patterned surface, that is a structured surface which usually shows regular or repetitive height differences over the entire surface area.

Particularly in the fabrication of integrated circuit and microelectromechanical devices, very high requirements have to be met for the CMP process step, which is carried out at each level of a multileveled structure. These requirements can be described by a series of parameters, among them: the material removal rate (MRR) that is the speed with which the to-be-polished material is removed; the step height reduction (SHR), which only applies to patterned surfaces and is the difference between the height of the regular, protruding features before and after the polishing.

The CMP compositions typically used in this field contain inorganic particles, such as silica and alumina, which serve as abrasives, and various additives. If dispersions containing only inorganic abrasive particles are used for CMP, undesirable scratches on the to-be-polished surfaces may be generated in the CMP step due to the hardness of these particles. Additives such as polymer particles help to overcome this problem: Owing to their considerably lower hardness and higher elasticity compared to inorganic particles, scratches on the to-be-polished surfaces can be reduced with dispersions comprising polymer particles.

In the state of the art, CMP compositions comprising inorganic particles and polymer particles are well-known, wherein the inorganic particles usually interact with polymer particles in at least one of the two ways: (a) interaction through chemical bonding; (b) interaction through electrostatic bonding. Electrostatic bonding is thought to occur if the inorganic and polymer particles are of opposite charge. The charge of the particles can be expressed as the so-called zeta potential, which is dependent on the pH value of the media in which the particles are dispersed.

CMP compositions comprising inorganic particles and polymer particles electrostatically bonded to inorganic particles are described, for instance, in the following references.

EP 1 036 836 B1 discloses an aqueous dispersion for CMP comprising polymer particles, inorganic particles and water, wherein the zeta potential of said polymer particles and the zeta potential of said inorganic particles are of opposite signs. Said particles are electrostatically bonded to form composite particles. This patent also discloses a method for producing the said aqueous dispersion, comprising the steps of (1) adding polymer particles and inorganic particles to water, (2) adjusting the pH such that the zeta potential of polymer particles and the zeta potential of inorganic particles are of opposite signs, (3) allowing the polymer particles and the inorganic particles to aggregate in order to form composite particles.

A similar method for preparing an aqueous dispersion for CMP is disclosed in EP 1 243 611 A1, comprising the preparation of a "pre-dispersion". Said "pre-dispersion contains polymer particles and inorganic particles having zeta potentials of the same sign. The "pre-dispersion" as such is not used for CMP, but is converted into a ready-to-use CMP dispersion in a further step, that is the reversal of the sign of the zeta-potential by pH adjustment.

The object of the present invention was to provide a CMP composition which is appropriate for the CMP of surfaces of dielectric substrates. A CMP composition was sought that would result in high material removal rates (MRR) and/or a high step height reduction (SHR) and would be ready-to-use. Furthermore, a respective CMP process was to be provided.

The above-mentioned and other objects of the invention are achieved by a CMP composition which comprises:
(A) at least one type of inorganic particles which are dispersed in the liquid medium (C),
(B) at least one type of polymer particles which are dispersed in the liquid medium (C),
(C) a liquid medium,
wherein the zeta-potential of the inorganic particles (A) in the liquid medium (C) and the zeta-potential of the polymer particles (B) in the liquid medium (C) are of same signs.

Moreover, the above-mentioned and other objects of the invention are achieved by a process for preparing a CMP composition, which comprises dispersing at least one type of inorganic particles (A) and at least one type of polymer particles (B) in a liquid medium (C), wherein the zeta-potential of the inorganic particles (A) in the liquid medium (C) and the zeta-potential of the polymer particles (B) in the liquid medium (C) are of same signs.

In addition, a process for the manufacture of semiconductor devices comprising the chemical mechanical polishing of a surface of a dielectric substrate in the presence of a CMP composition of the invention has been found.

Furthermore, a use of the CMP composition of the invention for the chemical mechanical polishing of surfaces of substrates which are used in the semiconductor industry has been found.

Preferred embodiments are explained in the claims and the specification. It is understood that combinations of preferred embodiments are within the scope of the present invention.

The CMP composition of the invention comprises at least one type, preferably one type, of inorganic particles (A) as the first essential component, and at least one type, preferably one type, of polymer particles (B) as the second essential component.

The inorganic particles (A) and polymer particles (B) comprised in the CMP composition of the invention have zeta potentials of the same sign. For instance, they may both have a negative or a positive zeta potential. Preferably, according to one embodiment, the CMP composition of the invention contains (A) and (B), both having a positive zeta potential.

The zeta potential of a particle is the potential at the plane where shear with respect to the bulk solution is postulated to occur. This plane, named shear plane, is located in the diffuse part of the electrical double layer and is interpreted as a sharp boundary between the hydrodynamically mobile and immobile fluid (see Measurement and Interpretation of Electrokinetic Phenomena by A. V. Delgado et al., Journal of Colloid and Interface Science 309 (2007), p. 194-224). As an indicator for the colloid stability of a dispersion, the zeta potential can be considered as an estimation for the surface charge of a particle and depends on the composition and pH of the liquid, temperature, ionic strength, and ionic species (see Engineering Polymer Core-Silica Shell Size in the Composite Abrasives for CMP Applications by S. Armini et al., Electrochemical and Solid-State Letters, 11 (10), H280-H284 (2008), first paragraph).

The value of the zeta potential $\zeta$ can be related to the electrophoretic mobility $\mu$ of particles and depends on the dimensionless quantity $\kappa a$, where a is the radius of the particle and $\kappa^{-1}$ the Debye length:

$$\zeta = \frac{3}{2}\frac{\eta}{\varepsilon}\frac{1}{f(\kappa a)}\mu \qquad (eq. 1)$$

where the values of $f(\kappa a)$ are calculated according to $$f(\kappa a) = \frac{3}{2} - \frac{9}{2(\kappa a)} + \frac{75}{2(\kappa a)^2} - \frac{330}{(\kappa a)^3} \qquad (eq. 2)$$

when the ionic strength of the dispersing medium is greater than $10^{-2}$ mol L$^{-1}$, and where $\in$ is the electric permittivity of the dispersing medium and $\eta$ the viscosity of the dispersing medium (see Characterizations and properties of hairy latex particles by P. Borget et al., Journal of Colloid and Interface Science 285 (2005), p. 136-145).

Using the above equations, zeta potential values are calculated on the basis of the values of electrophoretic mobility $\mu$, which can be directly determined with instruments such as Zetasizer Nano from Malvern Instruments, Ltd.

Since the zeta potential of polymer particles (B) has the same sign as that of inorganic particles (A) in the CMP composition of the invention, it is believed that no or essentially no attractive electrostatic interaction will occur between (A) and (B). Thus, the formation of coagulates is considered to be unlikely, so that the CMP composition of the invention is easy to handle and to store.

The CMP composition of the invention can contain the inorganic particles (A) as well as the polymer particles (B) in varying particle size distributions. The particle size distributions of (A) and (B) can be independent from each other. The particle size distributions of (A) and/or (B) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A) and/or (B). It is most preferred for A and B to have a monomodal particle size distribution.

For the CMP composition of the invention, the mean particle size of the inorganic particles (A) and the mean particle size of the polymer particles (B) can be independent from each other and can vary within a wide range. The mean particle size is the $d_{50}$ value of the particle size distribution of (A) or (B) in the liquid medium (C) and can be determined using dynamic light scattering techniques. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of (A) and/or (B) is in the range of from 10 to 500 nm, more preferably in the range of from 40 to 300 nm, most preferably in the range of from 80 to 150 nm, and in particular in the range of from 90 to 130 nm.

Preferably, the ratio of the mean particle size of (A) to the mean particle size of (B) is in the range of from 0.1 to 5.0, more preferably in the range of from 0.3 to 3.0, most preferably in the range of from 0.5 to 2, and in particular in the range of from 0.8 to 1.5.

The CMP composition of the invention can contain the inorganic particles (A) and the polymer particles (B) in varying amounts, wherein the amount of (A) can be independent from the amount of (B). Furthermore, the CMP composition of the invention can contain (A) and (B) in varying weight ratios.

Preferably, the amount of (A) is not more than 2 percent by weight, more preferably not more than 1 percent by weight, most preferably not more than 0.6 percent by weight, based on the total weight of a given CMP composition of the invention.

Preferably, the amount of (B) is not more than 0.4 percent by weight, more preferably not more than 0.2 percent by weight, most preferably not more than 0.1 percent by weight, based on the total weight of a given CMP composition of the invention.

Preferably, the weight ratio of (B) to (A) in the CMP composition is in the range of 0.001 to 0.2, more preferably in the range of from 0.001 to 0.15, most preferably in the range of from 0.001 to 0.1, and in particular in the range of from 0.001 to 0.06.

Since low amounts of inorganic particles (A) and extremely low amounts of polymer particles (B) are used in the CMP composition of the invention, the CMP composition has the advantage that it can be applied in a cost-effective way.

The inorganic particles (A) can be of various shapes. Thereby, the inorganic particles (A) may be of one or essentially only one type of shape. However, it is also possible that the inorganic particles (A) have different shapes. In particular, two types of differently shaped inorganic particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations. This shape, as a rule, is preferred because this shape usually increases the resistance to the mechanical forces the particles are exposed to during a CMP process.

The inorganic particles (A) can be of various chemical natures. (A) may be of the same chemical nature or a mixture of particles of different chemical nature. As a rule, inorganic particles (A) of the same chemical nature are preferred. (A) can be a metal or a metal compound, including a metalloid or a metalloid compound. Among these compounds, oxides and carbides of metals or metalloids are preferred. In general, oxides of metals or metalloids are preferred. (A) are for instance alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures thereof. Preferably, (A) are alumina, ceria, silica, titania, zirconia, or mixtures thereof. Most preferably, (A) are alumina, ceria, silica, or mixtures thereof. In particular, the inorganic particles (A) are ceria.

Generally, the chemical nature and morphology of the polymer particles (B) is only of secondary importance as long as (B) have the required zeta potential in the CMP composition of the invention. Of course it is possible that polymer particles (B) of a certain chemical nature and/or morphology may have an additional positive effect on the performance of the CMP compositions according to the invention.

The polymer particles (B) can be of various chemical natures. (B) may be of the same chemical nature or a mixture of particles of different chemical nature. As a rule, polymer particles (B) of the same chemical nature are preferred.

The polymer particles (B) can be of various morphologies. Preferably, their morphology is a core-shell type morphology.

Thus, (B) can be homo- or copolymers. The latter may for example be block-copolymers, or statistical copolymers. The homo- or copolymers may have various structures, for instance linear, branched, comb-like, dendrimeric, entangled or crosslinked.

In general, for the purposes of this invention, it is also of less significance according to which reaction mechanism or by which process the polymer particles (B) have been prepared. Thus, by way of example, (B) may be obtained according to the anionic, cationic, controlled radical, free radical mechanism and by the process of suspension or emulsion polymerisation. Preferably, (B) are obtained according to the free radical mechanism by emulsion polymerisation.

For the preferred way of polymerisation to obtain polymer particles (B), an initiator is required. Generally, any initiator capable of promoting radical polymerizations can be used. Preferably, at least one of organic peroxides or azo compounds is used as initiator. Most preferably, at least one of the aliphatic azo compounds are used as initiator. In particular, one of the azo compounds Azobisisobutyronitrile, 1,1'-Azobis(cyclohexanecarbonitrile) or 2,2'-Azobis(2-methylpropionamidine)dihydrochloride is used as initiator.

Typically, the polymer particles (B) are at least one of the polystyrenes, polyesters, alkyd resins, polyurethanes, polylactones, polycarbonates, poylacrylates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, N,N-dialkylaminoalkyl acrylates, N,N-dialkylaminoalkyl methacrylates, imidazole alkyl acrylates, imidazole alkyl methacrylates or acrylic acid, methacrylic acid as monomeric units, or mixtures thereof. Preferably, (B) is at least one of the said copolymers. More preferably, (B) is one of the said copolymers. Most preferably, (B) is a copolymer comprising at least one of vinylaromatic compounds, methacrylamides, N,N-dialkylaminoalkyl methacrylates or imidazole alkyl methacrylates as monomeric units. The vinylaromatic compound can for instance be styrene, or divinylbenzene, or a mixture thereof.

Polymer particles (B) which are copolymers as described above and which have a core-shell type morphology are particularly preferred.

Preferably, polymer particles (B) are polymer particles having at least one type of functional group which is cationic or capable of forming cations in an acidic aqueous phase. More preferably, polymer particles (B) are polymer particles having at least one type of functional group which is a dialkylamino group or an imidazole group.

According to one embodiment of the invention, polymer particles (B) are a copolymer comprising—in varying amounts—styrene, divinylbenzene, methacrylamide, N,N-dialkylaminoalkyl methacrylates, or imidazole alkyl methacrylates as monomeric units. In particular, (B) are a copolymer comprising:
(b1) 30 to 99.85% by weight styrene as monomeric units,
(b2) 0.05 to 30% by weight divinylbenzene as monomeric units,
(b3) 0.05 to 20% by weight methacrylamide as monomeric units,
(b4) 0.05 to 20% by weight N,N-dialkylaminoalkyl methacrylate or imidazole alkyl methacrylate as monomeric units,
wherein the sum of the weight percentages (b1) to (b4) add to 100%.

According to another embodiment of the invention, polymer particles (B) are a copolymer with a core-shell type morphology comprising—in varying amounts—styrene, divinylbenzene, methacrylamide, N,N-dialkylaminoalkyl methacrylates, or imidazole alkyl methacrylates as monomeric units. In particular, (B) are a copolymer with a core-shell type morphology comprising in the core-like region of its morphology
(b5) 30 to 99.9% by weight styrene as monomeric units,
(b6) 0.1 to 30% by weight divinylbenzene as monomeric units,
(b7) 0 to 20% by weight methacrylamide as monomeric units,
(b8) 0 to 20% by weight N,N-dialkylaminoalkyl acrylate or imidazole alkyl methacrylate as monomeric units,
and comprising in its shell-like region of its morphology
(b9) 0.5 to 90% by weight methacrylamide as monomeric units,
(b10) 0.5 to 90% by weight N,N-dialkylaminoalkyl acrylate or imidazole alkyl methacrylate as monomeric units,
(b11) 0 to 80% by weight styrene as monomeric units,
(b12) 0 to 19% by weight divinylbenzene as monomeric units,
wherein the sum of the weight percentages (b5) to (b8) add to 100% and the sum of the weight percentages (b9) to (b12) add to 100%.

Depending on their process of preparation, as it is widely known in the art, the polymer particles (B), in general as the preferred copolymers such as the particularly preferred copolymers with the core-shell type morphology, may comprise further components, such as the initiator as starting unit of the polymer chain. Furthermore, they may also incorporate or be associated with surfactants employed during the process of their preparation. Thus, for instance, these particularly preferred core-shell type copolymers also incorporate a non-covalently bound surfactant, preferably a quarternary ammonium surfactant, most preferably the surfactant hexadecyltrimethylammonium bromide. Preferably, the liquid medium (C) is an organic solvent, a mixture of different organic solvents, water, or a mixture thereof. More preferably, the liquid medium (C) is mixture of water and an organic solvent miscible with water (e.g. an alcohol, preferably a $C_1$ to $C_3$ alcohol, or an alkylene glycol derivative). Most preferably, the liquid medium (C) is water. In particular, the liquid medium (C) is de-ionized water.

CMP composition of the invention may also contain, if necessary, various other additives, including but not limited to pH adjusting agents, or surfactants. Said other additives are for instance those commonly employed in CMP compositions and thus known to the person skilled in the art. Such addition can for example stabilize the dispersion.

According to one embodiment, the CMP composition comprises
(A) ceria particles dispersed in the liquid medium (C),
(B) polymer particles dispersed in the liquid medium (C) and having at least one type of functional group which is cationic or capable of forming cations in an acidic aqueous phase
(C) water or a mixture of water and a $C_1$ to $C_3$ alcohol
wherein the zeta-potential of (A) and of (B) is positive.

According to another embodiment, the CMP composition comprises
(A) ceria particles dispersed in the liquid medium (C),
(B) polymer particles dispersed in the liquid medium (C) and having at least one type of functional group which is a dialkylamino group or an imidazole group
(C) water or de-ionized water
wherein the zeta-potential of (A) and of (B) is positive, and wherein
 the weight ratio of polymer particles (B) to inorganic particles (A) is in the range of from 0.001 to 0.2,
 the ratio of the mean particle size of the inorganic particles (A) to the mean particle size of the polymer particles (B) is in the range of from 0.1 to 3.0,
 the pH value is in the range of from 2.5 to 7.5.

According to a further embodiment, the CMP composition comprises
(A) ceria particles dispersed in the liquid medium (C),
(B) polymer particles dispersed in the liquid medium (C), having at least one type of functional group which is a dialkylamino group or an imidazole group, and being copolymers of the monomers vinyl aromatic compound, methacrylamide, acrylate and/or methacrylate
(C) water or de-ionized water
wherein the zeta-potential of (A) and of (B) is positive, and wherein
 the weight ratio of polymer particles (B) to inorganic particles (A) is in the range of from 0.001 to 0.1,
 the ratio of the mean particle size of the inorganic particles (A) to the mean particle size of the polymer particles (B) is in the range of from 0.5 to 2
 the pH value is in the range of from 3 to 6.5.

According to another embodiment, the CMP composition comprises
(A) ceria particles dispersed in the liquid medium (C),
(B) polymer particles dispersed in the liquid medium (C) and being copolymers of the monomers styrene, divinylbenzene, methacrylamide, N,N-dialkylaminoalkyl acrylate or imidazole alkyl acrylate
(C) water or de-ionized water
wherein the zeta-potential of (A) and of (B) is positive, and wherein
 the weight ratio of polymer particles (B) to inorganic particles (A) is in the range of from 0.001 to 0.06,
 the ratio of the mean particle size of the inorganic particles (A) to the mean particle size of the polymer particles (B) is in the range of from 0.8 to 1.3,
 the pH value is in the range of from 4.0 to 6.0.

The CMP composition of the invention are preferably prepared by dispersing at least one type of inorganic particles (A) and at least one type of polymer particles (B) in a liquid medium (C), wherein the zeta-potential of the inorganic particles (A) in the liquid medium (C) and the zeta-potential of the polymer particles in the liquid medium (C) are of same signs.

Processes for preparing CMP compositions are generally known. These processes may be applied to the preparation of the CMP composition of the invention. This can be carried out by dispersing the above-described components (A) and (B) in the liquid medium (C), in particular water, preferably de-ionized water. For this purpose the customary and standard mixing processes and mixing apparatuses such as agitated vessels, high shear impellers, ultrasonic mixers, homogenizer nozzles or counterflow mixers, can be used.

As the zeta potential depends on the pH of the CMP composition, this pH value has to be so adjusted that the zeta potential of polymer particles (B) has the same sign as that of inorganic particles (A). Preferably, the pH value of the CMP composition of the invention is in the range of from 2.5 to 7.5, more preferably from 3.0 to 6.5, and most preferably 4 to 6.

A process for the manufacture of semiconductor devices comprising the chemical mechanical polishing of a surface of a dielectric substrate in the presence of the CMP composition of the invention can be carried out. Preferably, this process comprises the chemical mechanical polishing of a patterned surface of a dielectric substrate.

The CMP composition of the invention may be used for the CMP of surfaces of substrates which are used in the semiconductor industry. The CMP composition of the invention is preferably used for the CMP of patterned or unstructured oxide surfaces, more preferably for the CMP of patterned oxide surfaces of a substrate, most preferably for the CMP of patterned oxide surfaces of a substrate which is a shallow trench isolation (STI) device. According to one embodiment, the CMP composition of the invention is used for the CMP of surfaces of a substrate which is a shallow trench isolation (STI) device.

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position (as an example for a CMP polisher see U.S. Pat. No. 6,050,885).

Below the carrier, the larger diameter platen is also generally horizontally positioned and presents a surface parallel to that of the wafer to be polished. The polishing pad on the platen contacts the wafer surface during the planarization process.

To produce material loss the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention the CMP composition of the invention is usually applied onto the polishing pad as a continuous stream or in dropwise fashion. Customarily, the temperature of the platen is set at temperatures of from 10 to 70° C.

The load on the wafer can be applied by a flat plate made of steel for example (hard platen design, see for instance figures in U.S. Pat. Nos. 4,954,142 or 6,093,091), covered with a soft pad that is often called backing film. If more advanced equipment is being used a flexible membrane that is loaded with air or nitrogen pressure (membrane carriers, for example see U.S. Pat. No. 6,767,276) presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded independently from each other (zone carriers, see for an example U.S. Pat. No. 7,207,871).

For further details reference is made to WO 2004/063301 A1, in particular page 16, paragraph [0036] to page 18, paragraph [0040] in conjunction with the FIG. 2.

By way of the CMP process of the invention and the CMP composition of the invention, wafers with integrated circuits comprising patterned oxide surfaces can be obtained which have an excellent functionality.

The CMP compositions of the invention can be used for the CMP of surfaces independent of whether they are unstructured or patterned. They show an improved polishing performance, particularly with regard to material removal rate (MRR) and step height reduction (SHR). Furthermore, the CMP compositions of the invention can be used in the CMP process as ready-to-use slurry, they show little—if at all—tendency to coagulate and settle, thus they are easy to handle and to store. Since the amounts of its components are held down to a minimum, the CMP compositions of the invention can be used in a cost-effective way.

EXAMPLES AND COMPARATIVE EXAMPLES

Inorganic Particles (A1)

Figure 1:
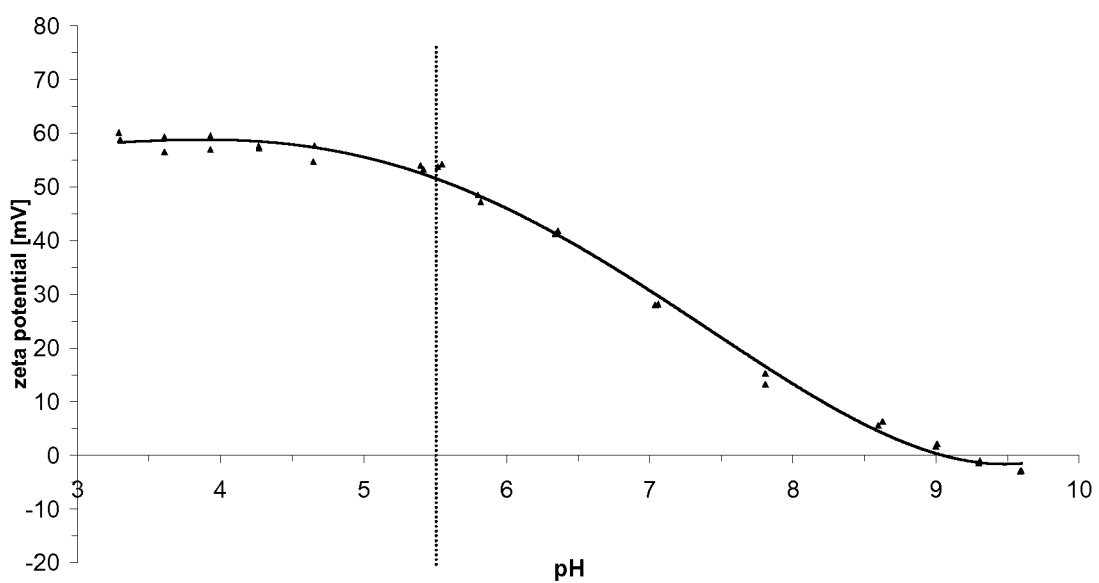
FIG. 1 shows the zeta potentials for a dispersion comprising inorganic particles (A1) and 10 mmol KCl (shown in triangles, extrapolation curve shown with a solid line) at different pH values, pH adjusted with HCl or NaOH.

Ceria particles having a mean particle size (d50) of 122 nm (as measured using dynamic light scattering techniques) were employed.

Synthesis of Polymer Particles (B2)

The reactor was purged with nitrogen. 1400 g of deionized water and 1.05 g of hexadecyltrimethylammonium bromide were stirred at 150 rpm and heated up to 70° C. At this temperature, 0.63 g of the initiator 2,2'-azobis(2-methylpropionamidine) hydrochloride was added. Subsequently, a monomer feed containing 588 g deionized water, 365.4 g styrene, 56 g of methacrylamide (as a 15% solution in water), 4.2 g of divinylbenzene, and 2.31 g of hexadecyltrimethylammonium bromide was continually fed for 1.5 hours. Alongside the monomer feed, an initiator feed containing 210 g of deionized water and 1.89 g of the said initiator was started and continually fed for 2.5 hours. After 1.5 hours from the start of the first monomer feed, a second monomer feed containing 238 g of deionized water, 13.4 g of dimethylaminoethylmethacrylate, 0.84 g of hexadecyltrimethylammonium bromide and 29.4 g of styrene was started and continually fed for 30 minutes. The resulting reaction mixture was post-polymerized for 2 hours at 70° C. and then cooled to room temperature. A dispersion of solid polymer particles (B2) with a solids content of 14.4% by weight was obtained. The mean particle size $d_{50}$ of the solid polymer particles was 110 nm as measured using dynamic light scattering technique with a High Performance Particle Sizer (HPPS) from Malvern Instruments, Ltd.

Synthesis of Polymer Particles (B3)

The reactor was purged with nitrogen. 1400 g of deionized water and 1.05 g of hexadecyltrimethylammonium bromide were stirred at 150 rpm and heated up to 70° C. At this temperature, 0.63 g of the initiator 2,2'-azobis(2-methylpropionamidine) hydrochloride was added. Subsequently, a monomer feed containing 588 g deionized water, 365.4 g styrene, 56 g of methacrylamide as a 15% solution in water, 4.2 g of divinylbenzene, and 2.31 g of hexadecyltrimethylammonium bromide was started and continually fed for 1.5 hours. Alongside the monomer feed, an initiator feed containing 210 g of deionized water and 1.89 g of the initiator was started and continually fed for 2.5 hours. After 1.5 hours from the start of the first monomer feed, a second monomer feed containing 238 g of deionized water, 13.4 g of hydroxyethylimidazole methacrylate, 0.84 g of hexadecyltrimethylammonium bromide and 29.4 g of styrene was started and continually fed for 30 minutes. The resulting reaction mixture was post-polymerized for 2 hours at 70° C. and then cooled to room temperature. A dispersion of solid polymer particles (B3) with a solids content of 14.4% by weight was obtained. The mean particle size $d_{50}$ of the solid polymer particles was 110 nm as measured using dynamic light scattering technique with a High Performance Particle Sizer (HPPS) from Malvern Instruments, Ltd.

Examples 1-9 (CMP Compositions of the Invention) and Comparative Example C1 (Comparative CMP Composition)

A dispersion of inorganic particles (A1) in de-ionized water was mixed with a dispersion of polymer particles (B2)-(B3) in de-ionized water in a specific weight ratio, furnishing the CMP compositions of the examples 1-9. For these examples, the weight percentages (wt %), that are the weight of the corresponding particles in percent of the total weight of the CMP composition, and the weight ratios are given in Table 1. As reference, a dispersion of said inorganic particles (A1) in de-ionized water which does not comprise any polymer particles (B) was used (comparative example C1). For all these examples, the pH was adjusted to 5.5 with an 10% aqueous solution of potassium hydroxide or with nitric acid (10%).

TABLE 1

CMP compositions of the examples 1-9 and of the comparative example C1

| CMP compositions | Inorganic particles (A1) = ceria | Polymer particles (B2) | Polymer particles (B3) | Weight ratio polymer:ceria |
|---|---|---|---|---|
| Example 1 | 0.5 wt % | 0.0025 wt % | | 0.005 |
| Example 2 | 0.5 wt % | 0.005 wt % | | 0.010 |
| Example 3 | 0.5 wt % | 0.0075 wt % | | 0.015 |
| Example 4 | 0.5 wt % | 0.0125 wt % | | 0.025 |
| Example 5 | 0.5 wt % | 0.025 wt % | | 0.05 |
| Example 6 | 0.5 wt % | | 0.0025 wt % | 0.005 |
| Example 7 | 0.5 wt % | | 0.005 wt % | 0.010 |
| Example 8 | 0.5 wt % | | 0.025 wt % | 0.05 |
| Example 9 | 0.5 wt % | | 0.125 wt % | 0.25 |
| Comparative Example C1 | 0.5 wt % | | | 0 |

Results of the Zeta Potential Measurements

Before the measurement, a first dispersion in water comprising inorganic particles (A1) and 10 mmol/L potassium chloride, a second dispersion in water comprising polymer particles (B2) and 10 mmol/L KCl, and the third dispersion in water comprising polymer particles (B3) and 10 mmol/L KCl were prepared. KCl was added in order to maintain a constant level of the ionic strength, which is the prerequisite for a good measurement. The pH value was adjusted with HCl or NaOH. In a measuring cell which is held on a temperature of 25° C., values of the electrophoretic mobility μ were directly determined with Zetasizer Nano from Malvern Instruments, Ltd. and then converted into the zeta potential by means of the above-mentioned equations (eq. 1) and (eq. 2). The dispersions were diluted directly prior to carrying out the measurement.

Under a given pH value, only the absolute values—but not the signs—of the electrophoretic mobility and of the thus calculated zeta potential of a given composition may vary depending on specific measurement conditions or instrument settings.

Figure 2:
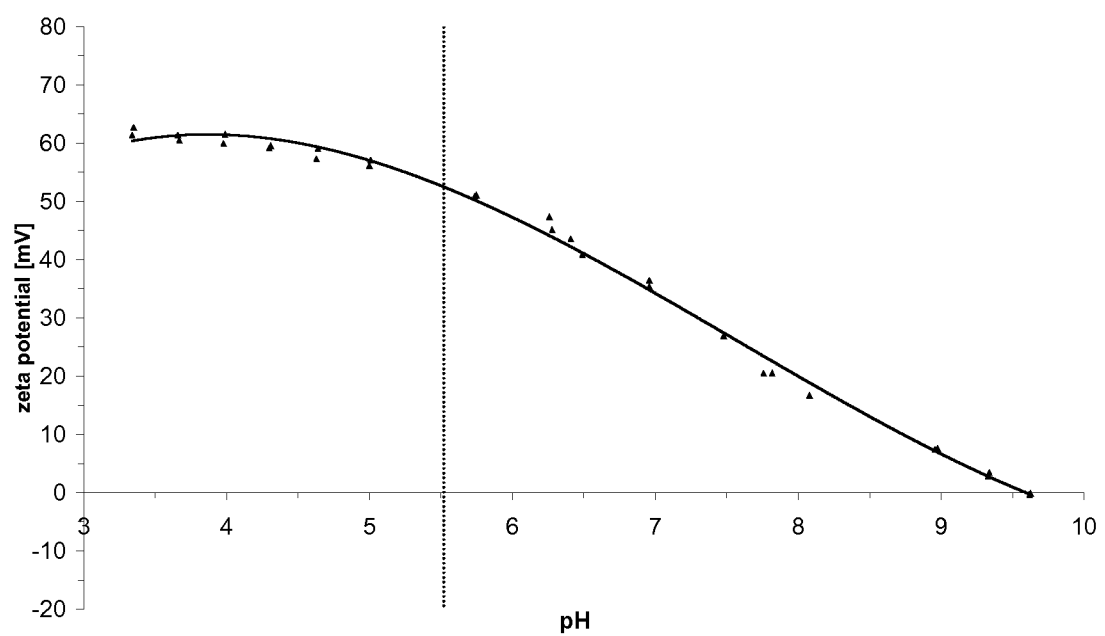
FIG. 2 shows the zeta potentials for a dispersion comprising polymer particles (B2) and 10 mmol KCl (shown in triangles, extrapolation curve shown with a solid line) at different pH values, pH adjusted with HCl or NaOH.
Figure 3:
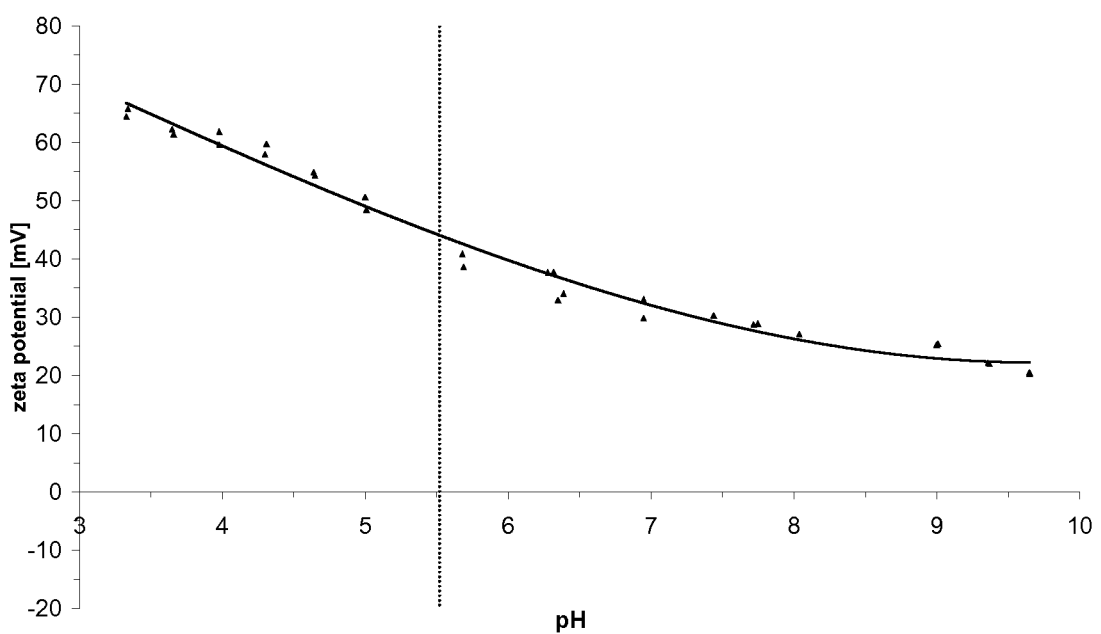
FIG. 3 shows the zeta potentials for a dispersion comprising polymer particles (B3) and 10 mmol KCl (shown in triangles, extrapolation curve shown with a solid line) at different pH values, pH adjusted with HCl or NaOH.

The data of the zeta potential measurements are shown in the figures FIG. 1, FIG. 2, and FIG. 3. These data clearly demonstrate that the sign of the zeta potential is positive for all three dispersions within a large pH range.

Results of the Particle Size Measurements

Figure 4:
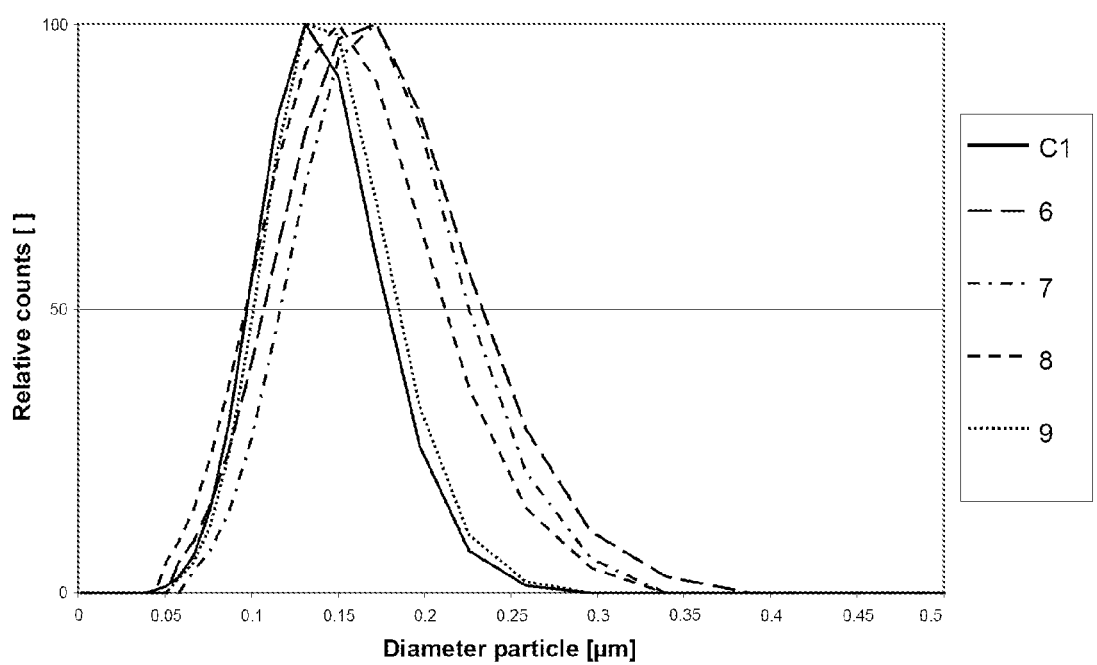
FIG. 4 shows the particle size distribution concentration series for the corresponding Examples (see box on the right side in the figure), with
C1=Example C1 (Weight ratio polymer:ceria=0)
6=Example 6 (Weight ratio polymer:ceria=0.005)
7=Example 7 (Weight ratio polymer:ceria=0.010)
8=Example 8 (Weight ratio polymer:ceria=0.050)
9=Example 9 (Weight ratio polymer:ceria=0.250).

Particle size measurements on the CMP compositions were carried out using dynamic light scattering technique with the device Horiba LB550. Data of these particle size measurements are given in FIG. 4 and Table 2.

Generally, ceria particles scatter much stronger than polymer particles. Because of the dominating contribution of the ceria to the total scattered intensity, the measured particle size distribution is supposed to be more a representation of the particle size distribution of the ceria than that of the polymer particles.

TABLE 2

Mean particle size ($d_{50}$) and width of particle size distribution, both given in nanometers [nm], for CMP compositions of the examples 6-9 and of the comparative example C1

| Weight ratio polymer:ceria | CMP composition | Mean particle size ($d_{50}$) | Width of particle size distribution |
|---|---|---|---|
| 0 | Comparative Example C1 | 122 | 82 |
| 0.005 | Example 6 | 145 | 127 |
| 0.010 | Example 7 | 150 | 110 |
| 0.050 | Example 8 | 131 | 116 |
| 0.250 | Example 9 | 126 | 84 |

General Procedure for the CMP Experiments

CMP experiments were carried out with 200 mm $SiO_2$ (PETEOS) coated blanket and patterned wafers. A 200 mm Strasbaugh 6EC polisher was used. For blanket wafers the polishing time was 60 s. Patterned wafers were polished for 20 s. Apart from that the following standard parameters were used:

Strasbaugh nSpire (Model 6EC), ViPRR floating retaining ring Carrier;
down pressure: 3.5 psi (240 mbar);
back side pressure: 0.5 psi (34.5 mbar);
retaining ring pressure: 2.5 psi (172 mbar);
polishing table/carrier speed: 95/85 rpm;
slurry flow rate: 200 ml/min;
pad conditioning: in situ (6 lbs, 27 N);
polishing pad: IC1000 A2 stacked pad, xy k grooved (R&H);
backing film: Strasbaugh, DF200 (136 holes);
conditioning disk: Kinik;

The pad is conditioned by several sweeps, before a new type of CMP composition is used for CMP. For the determination of removal rates at least 3 wafers are polished and the data obtained from these experiments are averaged.

The CMP composition is stirred in the local supply station.

The material removal rates (MRR) for blanket wafers polished by the CMP composition are determined by measuring the film thickness of the coated wafers on 49 points before and after CMP, using a Filmmetrics F50 reflectometer. These points are all located on one line going through the central point of the wafer. The average of the difference of film thickness before and after CMP on these 49 points is calculated and divided by the polishing time, thus yielding the values of the material removal rate.

The material removal rates (MRR) for patterned wafers polished by the CMP composition are determined by difference of weight of the coated wafers before and after CMP, using a Sartorius LA310 S scale. The difference of weight can be converted into the difference of film thickness since the density (1.9 kg/l for thermal $SiO_2$) and the surface area of the polished material are known. Dividing the difference of film thickness by the polishing time provides the values of the material removal rate.

The step height of test structures on a wafer is measured pre and post CMP with a stylus profilometer (KLA Tencor P16+). The difference is the step height reduction (SHR) obtained by the CMP process.

The pH value is measured with a pH combination electrode (Schott, blue line 22 pH).

The standard consumables for CMP of (semi) transparent coated wafers are: $SiO_2$ films: thermal $SiO_2$ or PETEOS; $Si_3N_4$ films: PE CVD; Poly Si films: CVD.

Results of the CMP Experiments

Data for material removal rate (MRR) and step height reduction (SHR) in the CMP process using the CMP compositions of the examples 1-9 and of the comparative example C1 are given in the Tables 3-6 (Ex.=Example; Comp. Ex.=Comparative Example):

TABLE 3

Material removal rate (MRR), given in Angström per minute [Å/min], for blanket SiO$_2$-coated wafers polished with CMP compositions of the examples 1-9 and of the comparative example C1

| Weight ratio | Comparative CMP compositions | CMP compositions of the invention comprising | |
|---|---|---|---|
| polymer:ceria | without polymer | polymer (B2) | polymer (B3) |
| 0 | 2948 (Comp. Ex. C1) | | |
| 0.005 | | 4431 (Ex. 1) | 5016 (Ex. 6) |
| 0.010 | | 3942 (Ex. 2) | 5062 (Ex. 7) |
| 0.015 | | 4268 (Ex. 3) | |
| 0.025 | | 3297 (Ex. 4) | |
| 0.050 | | 2428 (Ex. 5) | 2758 (Ex. 8) |
| 0.250 | | | 1080 (Ex. 9) |

TABLE 4

Material removal rate (MRR), given in Angström per minute [Å/min], for patterned SiO$_2$-coated wafers polished with CMP compositions of the examples 1-9 and of the comparative example C1

| Weight ratio | Comparative CMP compositions | CMP compositions of the invention comprising | |
|---|---|---|---|
| polymer:ceria | without polymer | polymer (B2) | polymer (B3) |
| 0 | 2714 (Comp. Ex. C1) | | |
| 0.005 | | 4824 (Ex. 1) | 2815 (Ex. 6) |
| 0.010 | | 4473 (Ex. 2) | 3468 (Ex. 7) |
| 0.015 | | 4776 (Ex. 3) | |
| 0.025 | | 3669 (Ex. 4) | |
| 0.050 | | 3216 (Ex. 5) | 5428 (Ex. 8) |
| 0.250 | | | 5227 (Ex. 9) |

TABLE 5

Step height reduction (SHR), given in Angström [Å], for patterned SiO$_2$-coated wafers (pitch: 200 µm, 50% density) polished with CMP compositions of the examples 1-9 and of the comparative example C1

| Weight ratio | Comparative CMP compositions | CMP compositions of the invention comprising | |
|---|---|---|---|
| polymer:ceria | without polymer | polymer (B2) | polymer (B3) |
| 0 | 1005 (Comp. Ex. C1) | | |
| 0.005 | | 2225 (Ex. 1) | 1838 (Ex. 6) |
| 0.010 | | 2877 (Ex. 2) | 2274 (Ex. 7) |
| 0.015 | | 2836 (Ex. 3) | |
| 0.025 | | 2319 (Ex. 4) | |
| 0.050 | | 1851 (Ex. 5) | 2299 (Ex. 8) |
| 0.250 | | | 1630 (Ex. 9) |

TABLE 6

Step height reduction (SHR), given in Angström [Å], for patterned SiO$_2$-coated wafers (pitch: 100 µm, 50% density) polished with CMP compositions of the examples 1-9 and of the comparative example C1

| Weight ratio | Comparative CMP compositions | CMP compositions of the invention comprising | |
|---|---|---|---|
| polymer:ceria | without polymer | polymer (B2) | polymer (B3) |
| 0 | 1129 (Comp. Ex. C1) | | |
| 0.005 | | 2192 (Ex. 1) | 1863 (Ex. 6) |
| 0.010 | | 2821 (Ex. 2) | 2097 (Ex. 7) |
| 0.015 | | 2765 (Ex. 3) | |
| 0.025 | | 2352 (Ex. 4) | |
| 0.050 | | 1769 (Ex. 5) | 2418 (Ex. 8) |
| 0.250 | | | 1881 (Ex. 9) |

These examples of the CMP compositions of the invention improve the polishing performance, particularly with regard to material removal rate (MRR) and step height reduction (SHR).

The invention claimed is:

1. A chemical mechanical polishing (CMP) composition, comprising:
   (A) inorganic particles, dispersed in a liquid medium (C), and
   (B) polymer particles, dispersed in the liquid medium (C),
   wherein a zeta-potential of the inorganic particles (A) in the liquid medium (C) and a zeta-potential of the polymer particles (B) in the liquid medium (C) are positive, and
   the polymer particles (B) comprise a dialkylamino group, an imidazole group, or a combination thereof.

2. The CMP composition of claim 1, wherein a concentration of the polymer particles (B) is not more than 0.4% by weight of the CMP composition.

3. The CMP composition of claim 1, wherein a concentration of the polymer particles (B) is not more than 0.2% by weight of the CMP composition.

4. The CMP composition of claim 1, wherein a concentration of inorganic particles (A) is not more than 1% by weight of the CMP composition.

5. The CMP composition of claim 1, wherein a concentration of inorganic particles (A) is not more than 0.6% by weight of the CMP composition.

6. The CMP composition of claim 1, wherein a ratio of a mean particle size of the inorganic particles (A) to a mean particle size of the polymer particles (B) is from 0.1 to 5.0.

7. The CMP composition of claim 1, wherein a weight ratio of polymer particles (B) to inorganic particles (A) is from 0.001 to 0.2.

8. The CMP composition of claim 1, wherein the inorganic particles (A) are alumina, ceria, silica, titania, or zirconia, or a mixture thereof.

9. The CMP composition of claim 1, wherein the inorganic particles (A) are ceria.

10. The CMP composition of claim 1, wherein a pH of the composition is from 4 to 6.

11. The CMP composition of claim 1, comprising:
(A) ceria particles,
(B) polymer particles comprising a dialkylamino group, an imidazole group, or a combination thereof, and
(C) water,
wherein a ratio of a mean particle size of (A) to a mean particle size of (B) is from 0.1 to 5.0,
a weight ratio of (B) to (A) is from 0.001 to 0.2, and
a pH of the composition is from 2.5 to 7.5.

12. A process for preparing a CMP composition, comprising:
dispersing inorganic particles (A) and polymer particles (B) in a liquid medium (C),
wherein a zeta-potential of the inorganic particles (A) in the liquid medium (C) and a zeta-potential of the polymer particles (B) in the liquid medium (C) are positive, and
the polymer particles (B) comprise a dialkylamino group, an imidazole group, or a combination thereof.

13. A process for manufacturing a semiconductor device, comprising:
polishing, in a chemical mechanical polishing, a surface of a dielectric substrate in the presence of the CMP composition of claim 1.

14. The process of claim 13, wherein the substrate is a shallow trench isolation (STI) device.

15. The CMP composition of claim 1, wherein the CMP composition comprises only one type of inorganic particles (A).

16. The CMP composition of claim 1, wherein the CMP composition comprises only one type of polymer particles (B).

17. The CMP composition of claim 1, wherein a particle size distribution of inorganic particles (A), a particle size distribution of polymer particles (B), or both, is monomodal.

18. The CMP composition of claim 1, wherein a mean particle size of inorganic particles (A) is from 10 to 500 nm.

19. The CMP composition of claim 1, wherein a mean particle size of polymer particles (B) is from 10 to 500 nm.

* * * * *